United States Patent
Wen et al.

(10) Patent No.: US 11,309,839 B2
(45) Date of Patent: Apr. 19, 2022

(54) HIGH SIGNAL-TO-NOISE RATIO AMPLIFIER WITH MULTIPLE OUTPUT MODES

(71) Applicant: MEDIATEK INC., Hsinchu (TW)

(72) Inventors: Sung-Han Wen, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 121 days.

(21) Appl. No.: 16/793,226

(22) Filed: Feb. 18, 2020

(65) Prior Publication Data
US 2020/0358400 A1 Nov. 12, 2020

Related U.S. Application Data

(60) Provisional application No. 62/843,650, filed on May 6, 2019.

(51) Int. Cl.
*H03F 3/19* (2006.01)
*H03F 1/02* (2006.01)
(Continued)

(52) U.S. Cl.
CPC ........... *H03F 1/02* (2013.01); *H03F 3/04* (2013.01); *H03G 3/30* (2013.01); *H03G 2201/103* (2013.01)

(58) Field of Classification Search
CPC ...... H03F 1/02; H03F 3/04; H03F 2203/7233; H03F 1/3247; H03F 2200/03; H03F 3/181; H03F 2203/7239; H03F 2200/156; H03F 2200/153; H03F 2200/408; H03F 2200/405; H03F 2200/372; H03F 2203/7236; H03F 1/08; H03F 3/211; H03F 1/26; H03F 1/34; H03F 3/72; H03F 1/56; H03F 3/19; H03F 2200/451; H03F 2200/54; H03F 2203/45051; H03F 2200/36;
(Continued)

(56) References Cited

U.S. PATENT DOCUMENTS 5,999,047 A * 12/1999 Zhang .................. H03F 1/3276
330/129
6,359,992 B1 * 3/2002 Preves .................... H03F 3/181
381/312

(Continued)

OTHER PUBLICATIONS

Mehta, N., et al.; "A 1-mW Class-AB Amplifier With −101 dB THD+N for High-Fidelity 16Ohm Headphones in 65-nm CMOS;" IEEE Journal of Solid-State Circuits; vol. 54; No. 4; Apr. 2019; pp. 948-958.

(Continued)

*Primary Examiner* — Khanh V Nguyen
(74) *Attorney, Agent, or Firm* — McClure, Qualey & Rodack, LLP

(57) ABSTRACT

A multi-stage amplifier with a high signal-to-noise ratio is introduced. Multiple amplification stages are cascaded between an input terminal and an output terminal of the amplifier. A controller switches the output stage among the multiple amplification stages from a normal mode to an attenuation mode in response to the amplifier input being lower than the threshold. In the attenuation mode, the output stage provides an attenuation resistor coupled in series with the load resistor of the amplifier. Noise is successfully attenuated by the attenuation-mode output stage.

17 Claims, 3 Drawing Sheets

(51) Int. Cl.
*H03F 3/04* (2006.01)
*H03G 3/30* (2006.01)

(58) Field of Classification Search
CPC .......... H03F 3/45475; H03F 3/02; H03F 1/50; H03G 3/30; H03G 2201/103; H03G 1/0088; H03G 3/001; H03G 3/3036; H03B 5/1221
USPC .................................. 330/98, 150, 284, 310
See application file for complete search history.

(56) References Cited

U.S. PATENT DOCUMENTS

| | | | |
|---|---|---|---|
| 8,311,243 B2 | 11/2012 | Tucker et al. | |
| 10,044,323 B1 * | 8/2018 | He | H03F 3/45475 |
| 10,396,735 B2 * | 8/2019 | Bergsma | H03G 1/0088 |
| 2012/0087515 A1 | 4/2012 | Poulsen et al. | |
| 2013/0249626 A1 | 9/2013 | Matsunaga et al. | |

OTHER PUBLICATIONS

Wen, S.H., et al.; "A −105dBc THD+N (−114dBc HD2) at 2.8VPP Swing and 120dB DR Audio Decoder with Sample-and-Hold Noise Filtering and Poly Resistor Linearization Schemes;" IEEE International Solid-State Circuits Conference; Feb. 2019; pp. 294-296.

Taiwan Office Action, dated Nov. 25, 2020, in application No. 0758-B35954.

European Search Report, dated Sep. 16, 2020, in application No. 20165202.1-1203.

Shen, et al., "Neuromorphic Pitch Based Noise Reduction For Monosyllable Hearing Aid System Application" (published on Feb. 1, 2014).

European Office Action dated Dec. 9, 2021, issued in application No. EP 20 165 202.1.

* cited by examiner

HIGH SIGNAL-TO-NOISE RATIO AMPLIFIER WITH MULTIPLE OUTPUT MODES

CROSS REFERENCE TO RELATED APPLICATIONS

This application claims the benefit of U.S. Provisional Application No. 62/843,650, filed on May 6, 2019, the entirety of which is incorporated by reference herein.

BACKGROUND OF THE INVENTION

Field of the Invention

The present invention relates to an amplifier design.

Description of the Related Art

For most systems, a single amplification stage does not provide sufficient gain or bandwidth, or it will not have the correct input or output impedance matching. The solution is to combine multiple amplification stages.

A multi-stage amplifier may be used to achieve the desired performance by cascading several amplification stages. Using a three-stage amplifier as an example, the output of the first amplification stage is used as the input of the second amplification stage, and the output of the second amplification stage is used as the input of the third amplification stage. The first amplification stage is the input stage, and the third amplification stage is the output stage. To achieve the desired SNR (signal-to-noise ratio), the input stage may be large in size. However, the larger the circuit size, the more power is consumed. The stability of the circuit may be also affected.

A high-SNR amplifier with limited power consumption, acceptable circuit size, and high stability is called for.

BRIEF SUMMARY OF THE INVENTION

An amplifier with multiple output modes is introduced.

An amplifier in accordance with an exemplary embodiment of the present invention includes a plurality of amplification stages and a controller. The amplification stages are cascaded between an input terminal and an output terminal of the amplifier. An output stage among the plurality of amplification stages is switched between a normal mode and an attenuation mode. The controller switches the output stage from the normal mode to the attenuation mode in response to the amplifier input being lower than the threshold. In the attenuation mode, the output stage provides an attenuation resistor coupled in series with the load resistor of the amplifier. Noise is successfully attenuated by the attenuation-mode output stage.

In an exemplary embodiment, the controller switches the output stage from the normal mode to the attenuation mode at zero-crossing points of the output signal of the amplifier.

In an exemplary embodiment, the amplifier input is a digital signal from a digital analog front-end (AFE) circuit and is converted to an analog form to be amplified by the amplifier.

In an exemplary embodiment, the controller controls the digital analog front-end circuit to digitally compensate for signal attenuation due to the attenuation resistor. The digital analog front-end circuit may digitally compensate for signal attenuation due to the attenuation resistor by a digital gain. When operating the output stage in the attenuation mode, the controller may increase the resistance of the attenuation resistor step-by-step and increase the digital gain accordingly.

In an exemplary embodiment, the amplifier has a feedback circuit coupling the feedback signal of the output signal of the amplifier to an input stage among the plurality of amplification stages. The controller controls the feedback circuit to compensate for signal attenuation due to the attenuation resistor. The controller may control resistance of the feedback circuit to compensate for signal attenuation due to the attenuation resistor by an analog gain. When operating the output stage in the attenuation mode, the controller may increase the resistance of the attenuation resistor step-by-step and increase the resistance of the feedback circuit accordingly.

In an exemplary embodiment, the controller switches the output stage from the attenuation mode to the normal mode in response to the amplifier input reaching the threshold. The controller may switch the output stage between the normal mode and the attenuation mode at zero-crossing points of the output signal of the amplifier.

In an exemplary embodiment, the resistance of the attenuation resistor is greater than the resistance of the load resistor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
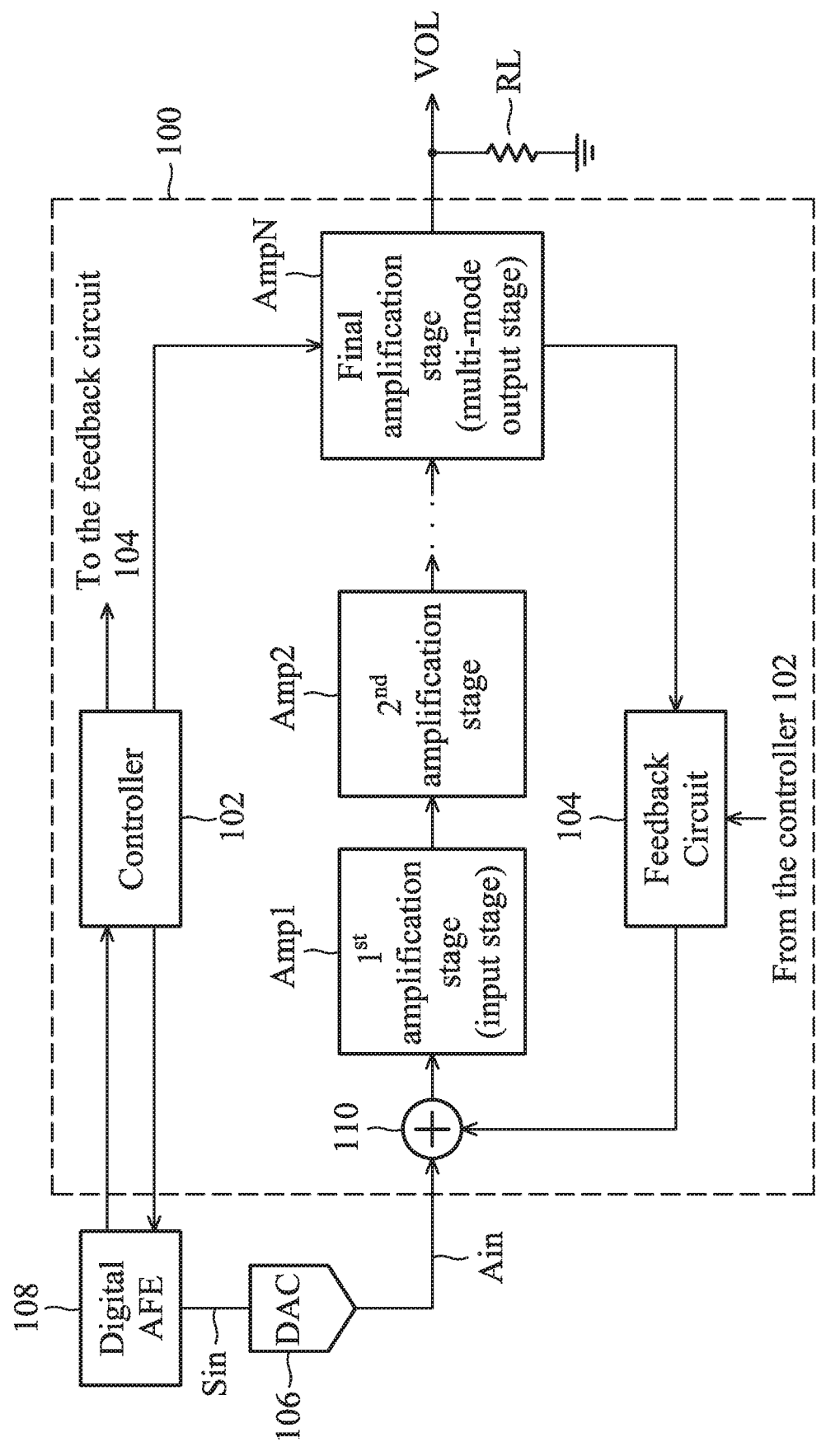
FIG. 1 depicts an amplifier 100 in accordance with an exemplary embodiment of the present invention.

FIG. 1 depicts an amplifier 100 in accordance with an exemplary embodiment of the present invention. The amplifier 100 includes cascaded amplification stages, Amp1, Amp2 . . . and AmpN, a controller 102, and a feedback circuit 104.

The first amplification stage Amp1 is an input stage. The final amplification stage AmpN is an output stage. An amplifier input Sin converted to an analog form Ain to be amplified by the amplifier 100 may be provided by a digital analog front-end (digital AFE) circuit 108. The amplifier 100 has an input terminal receiving the analog form Ain of the amplifier input Sin, and has an output terminal outputting an output signal VOL to drive a load resistor RL. The feedback circuit 104 couples the output stage AmpN to the input stage Amp1 (e.g., via an adder 110). The output stage AmpN provides the feedback circuit 104 with a feedback signal of the output signal VOL. The multi-stage amplification (Amp1 . . . AmpN) is based on the amplifier input Sin as well as the feedback signal of the output signal VOL. Specifically, the output stage AmpN is specially designed and an accompanying controller 102 is required.

The output stage AmpN is switched between a normal mode and an attenuation mode. The controller 102 is coupled to the digital AFE 108 to get information about the amplifier input Sin. In response to the amplifier input Sin lower than a threshold Sth (e.g., —40 dBFS, where FS means the full-scale signal), the controller 102 switches the output stage AmpN from the normal mode to the attenuation mode. Noise is effectively suppressed. However, compensation for the signal attenuation due to the attenuation-mode output stage is required. The controller 102 may control the digital AFE 108 for digital compensation or control the feedback circuit 104 for analog compensation.

The amplifier 100 uses the multi-mode output stage AmpN to achieve a high signal-to-noise ratio (SNR). There is no need to excessively enlarge the size of the input stage Amp1. The power consumption of the amplifier 100 is reasonable. The amplifier 100 is a low-cost design with high stability.

The controller 102 may switch the output stage AmpN from the attenuation mode back to the normal mode in response to the amplifier input Sin reaching the threshold Sth (e.g., -40 dBFS). For large-signal amplification, the performance is mainly related to THD (total harmonic distortion). The normal-mode output stage is preferred.

Figure 2:
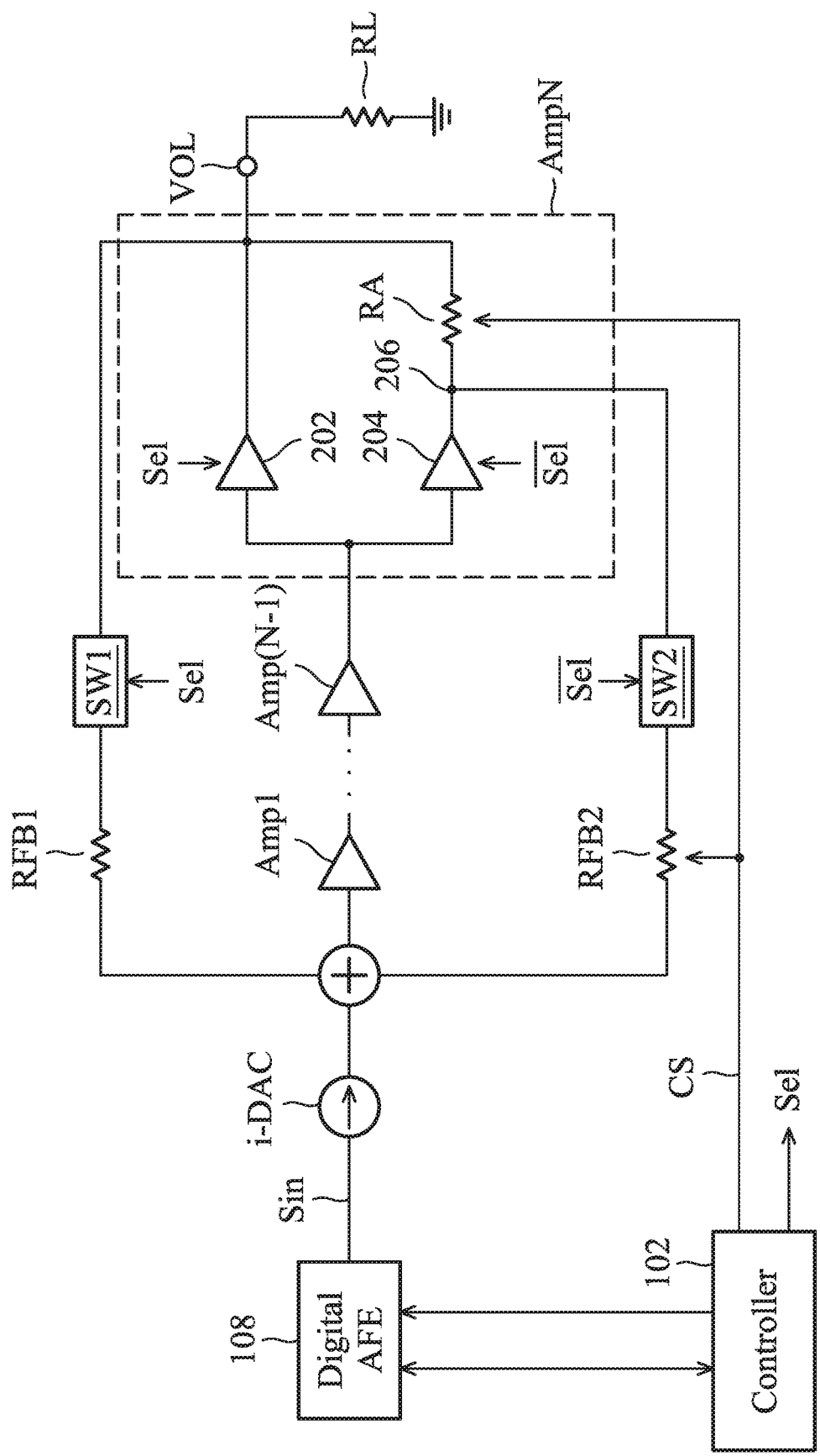
FIG. 2 illustrates the details of the amplifier 100 in accordance with an exemplary embodiment of the present invention.

FIG. 2 illustrates the details of the amplifier 100 in accordance with an exemplary embodiment of the present invention. The controller 102 outputs a selection signal Sel ($\overline{Sel}$) to switch the output stage AmpN between the normal mode and the attenuation mode. The controller 102 further outputs a control signal CS to gradually attenuate the noise and gradually compensate for the signal attenuation when operating the output stage AmpN in the attenuation mode.

The output stage AmpN includes operational amplifiers 202 and 204 and an attenuation resistor RA. When the output stage AmpN is in the normal mode, the operational amplifier 202 is enabled and the operational amplifier 204 is disabled. The second-to-last amplification stage Amp(N-1) is coupled to the output terminal (referring to VOL) of the amplifier through the operational amplifier 202. When the output stage AmpN is in the attenuation mode, the operational amplifier 202 is disabled and the operational amplifier 204 is enabled. The second-to-last amplification stage Amp(N-1) is coupled to the output terminal (referring to VOL) of the amplifier through the operational amplifier 204 and the attenuation resistor RA. The output stage AmpN provides the attenuation resistor RA to be coupled in series with the load resistor RL. Noise is attenuated by the series circuit that includes the attenuation resistor RA and the load resistor RL.

The attenuation resistor RA may be larger than the load resistor RL. For example, the resistance of the attenuation resistor RA may be k times the resistance of the load resistor RL, and k is a number greater than 1. In an exemplary embodiment, k is 3, so that the attenuation introduced by the attenuation resistor RA is -12 dB. In another example, k is 8, so that the attenuation introduced by the attenuation resistor RA is -18 dB. Noise is effectively attenuated. However, compensation for signal attenuation is required.

The signal attenuation due to the attenuation-mode output stage may be compensated for in the digital domain or the analog domain. The compensation may depend on the resistance ratio, k, between the attenuation resistor RA and the load resistor RL.

In an exemplary embodiment, the controller 102 may control the digital AFE 108 to compensate for signal attenuation due to the attenuation resistor RA by a digital gain.

The attenuation resistor RA may a variable resistor. When operating the output stage AmpN in the attenuation mode, the controller 102 increases the resistance of the attenuation resistor RA gradually (e.g., step-by-step) and, accordingly, increases the digital gain step-by-step.

In another exemplary embodiment, the controller 102 performs analog compensation along the feedback path.

In FIG. 2, there are two feedback resistors RFB1 and RFB2 and two switches SW1 and SW2, which form the feedback circuit 104 of FIG. 1. The feedback resistor RFB1 and the switch SW1 are connected in series. The feedback resistor RFB2 and the switch SW2 are connected in series. When the output stage AmpN is in the normal mode, the switch SW1 is closed and the switch SW2 is open, and the output terminal (referring to VOL) of the amplifier is coupled to the input stage Amp1 via the feedback resistor RFB1. When the output stage AmpN is in the attenuation mode, the switch SW2 is closed and the switch SW1 is open, and an output terminal 206 of the operational amplifier 204 is coupled to the input stage Amp1 via the feedback resistor RFB2. The resistance of the feedback resistor RFB2 may be specially designed to compensate for the signal attenuation due to the attenuation resistor RA. In the example wherein the resistance of the attenuation resistor RA is k times the resistance of the load resistor (RA=k*RL), the resistance of the feedback resistor RFB2 is k times the resistance of the resistor RFB1 (RFB2=k*RFB1).

The signal attenuation due to the attenuation resistor RA is compensated for by an analog gain introduced by the feedback path.

The attenuation resistor RA and the feedback resistor RFB2 both can be variable resistors. When operating the output stage AmpN in the attenuation mode, the controller 102 increases the resistance of the attenuation resistor RA gradually (e.g., step-by-step) and, accordingly, increases the feedback resistor RFB2 step-by-step.

The amplifier shown in FIG. 2 is an I-V amplifier. However, the multi-mode output stage AmpN may be also applied on a V-V amplifier.

Specifically, the controller 102 may switch the output stage AmpN between the normal mode and the attenuation mode at zero-crossing points of the output signal VOL of the amplifier 100. For example, when using the amplifier 100 as a headphone amplifier, switching the mode of the output stage AmpN at the zero-crossing points of the output signal Vo makes for a good user experience (i.e. there are no glitches).

Figure 3:
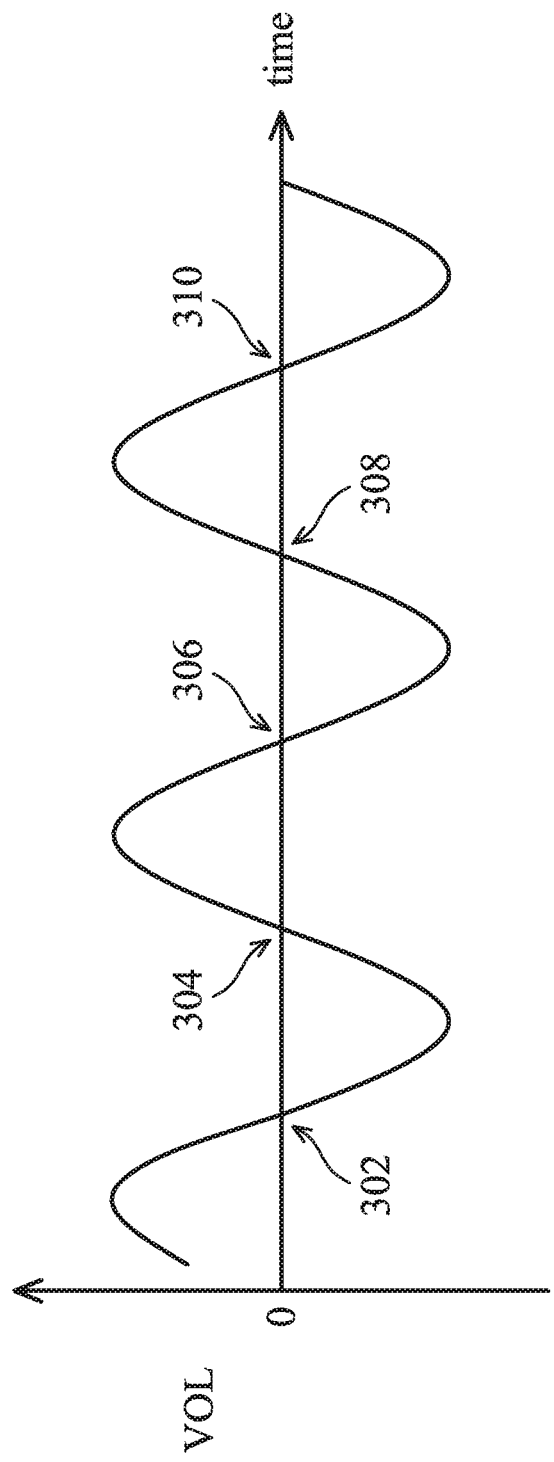
FIG. 3 shows a waveform of the output signal VOL.

FIG. 3 shows a waveform of the output signal VOL. The controller 102 may switch the output stage AmpN between the normal mode and the attenuation mode at zero-crossing points 302, 304, 306, 308 and 310.

The controller 102 may predict the zero-crossing points of the output signal VOL in accordance with the information, obtained from the digital AFE 108, about the amplified signal Sin.

Any amplifier with an output stage using the attenuation resistor RA should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
a plurality of amplification stages, cascaded between an input terminal and an output terminal of the amplifier, wherein an output stage among the plurality of amplification stages is switched between a normal mode and an attenuation mode;
a controller, operable to switch the output stage from the normal mode to the attenuation mode in response to an amplifier input signal at the input terminal being lower than a threshold;
a first feedback resistor and a first switch, connected in series; and
a second feedback resistor and a second switch, connected in series;
wherein:
when the output stage is in the normal mode, the first switch is closed and the second switch is open, and the output terminal of the amplifier is coupled to an input stage among the plurality of amplification stages via the first feedback resistor; and
when the output stage is in the attenuation mode, the second switch is closed and the first switch is open, the output stage provides an attenuation resistor coupled in series with a load resistor of the amplifier, a first terminal of the attenuation resistor is coupled to the input stage via the second feedback resistor and a second terminal of the attenuation resistor is coupled to the load resistor.

2. The amplifier as claimed in claim 1, wherein:
the controller is operable to switch the output stage from the normal mode to the attenuation mode at zero-crossing points of an output signal of the amplifier.

3. The amplifier as claimed in claim 1, wherein:
the amplifier is operable to receive the amplifier input signal, and a digital signal from a digital analog front-end circuit is converted to an analog form as the amplifier input signal to be amplified by the amplifier.

4. The amplifier as claimed in claim 3, wherein:
the controller controls the digital analog front-end circuit to digitally compensate for signal attenuation due to the attenuation resistor.

5. The amplifier as claimed in claim 4, wherein:
the digital analog front-end circuit uses a digital gain to digitally compensate for signal attenuation due to the attenuation resistor.

6. The amplifier as claimed in claim 5, wherein:
when operating the output stage in the attenuation mode, the controller increases resistance of the attenuation resistor step-by-step.

7. The amplifier as claimed in claim 6, wherein:
when increasing the resistance of the attenuation resistor step-by-step, the controller increases the digital gain accordingly.

8. The amplifier as claimed in claim 1, further comprising:
a feedback circuit comprising the first feedback resistor, the first switch, the second feedback resistor, and the second switch, coupling a feedback signal of an output signal of the amplifier to an input stage among the plurality of amplification stages,
wherein the controller controls the feedback circuit to compensate for signal attenuation due to the attenuation resistor.

9. The amplifier as claimed in claim 8, wherein:
the controller controls resistance of the feedback circuit to use an analog gain to compensate for signal attenuation due to the attenuation resistor.

10. The amplifier as claimed in claim 9, wherein:
when operating the output stage in the attenuation mode, the controller increases resistance of the attenuation resistor step-by-step.

11. The amplifier as claimed in claim 10, wherein:
when increasing the resistance of the attenuation resistor step-by-step, the controller increases the resistance of the feedback circuit accordingly.

12. The amplifier as claimed in claim 1, wherein:
the controller switches the output stage from the attenuation mode to the normal mode in response to the amplifier input signal reaching the threshold.

13. The amplifier as claimed in claim 12, wherein:
the controller switches the output stage between the normal mode and the attenuation mode at zero-crossing points of an output signal of the amplifier.

14. The amplifier as claimed in claim 1, wherein:
resistance of the attenuation resistor is greater than resistance of the load resistor.

15. The amplifier as claimed in claim 1, wherein:
the output stage further includes a first operational amplifier enabled in the normal mode and disabled in the attenuation mode and a second operational amplifier disabled in the normal mode and enabled in the attenuation mode;
when the output stage is in the normal mode, a second-to-last amplification stage is coupled to the output terminal of the amplifier through the first operational amplifier; and
when the output stage is in the attenuation mode, the second-to-last amplification stage is coupled to the output terminal of the amplifier through the second operational amplifier and the attenuation resistor.

16. The amplifier as claimed in claim 1, wherein:
resistance of the attenuation resistor is greater than resistance of the load resistor; and
resistance of the second feedback resistor is greater than the first feedback resistor.

17. The amplifier as claimed in claim 1, wherein:
resistance of the attenuation resistor is k times the load resistor;
resistance of the second feedback resistor is k times the first feedback resistor; and
k is a number greater than 1.

* * * * *